United States Patent
Hsieh et al.

(10) Patent No.: US 7,113,029 B2
(45) Date of Patent: Sep. 26, 2006

(54) TRANSCONDUCTANCE FILTER CIRCUIT

(75) Inventors: Yi-Bin Hsieh, Taipei (TW); Wen-Hui Chen, Taipei (TW)

(73) Assignee: VIA Technologies Inc., Taipei (TW)

( * ) Notice: Subject to any disclaimer, the term of this patent is extended or adjusted under 35 U.S.C. 154(b) by 0 days.

(21) Appl. No.: 11/103,874

(22) Filed: Apr. 12, 2005

(65) Prior Publication Data

US 2006/0006931 A1 Jan. 12, 2006

(30) Foreign Application Priority Data

Jul. 8, 2004 (TW) .............................. 93120435 A

(51) Int. Cl.
*H03K 5/00* (2006.01)

(52) U.S. Cl. ...................................... 327/553; 327/554

(58) Field of Classification Search ........ 327/552–559, 327/103
See application file for complete search history.

(56) References Cited

U.S. PATENT DOCUMENTS 5,726,600 A * 3/1998 Raghavan et al. .......... 327/553
6,400,932 B1 * 6/2002 Oh et al. .................. 455/150.1

* cited by examiner

*Primary Examiner*—Dinh T. Le
(74) *Attorney, Agent, or Firm*—Thomas, Kayden, Horstemeyer & Risley

(57) ABSTRACT

Transconductance filter circuits. A transconductor includes two inputs for receiving two differential voltages, and a first output terminal and a second output terminal for outputting two differential signals. A first capacitor array includes at least one first switch capacitor unit controlled by a first signal, and a first equivalent capacitor coupled between the first output terminal and the second output terminal when the first signal is enabled. two second capacitor arrays each includes at least one second switch capacitor unit controlled by a second signal, two second equivalent capacitors respectively coupled between the first output terminal and a ground level, and between the second output terminal and the ground level when the second signal is enabled. The capacitance of the first equivalent capacitor exceeds that of the two second equivalent capacitors connected in serial.

8 Claims, 5 Drawing Sheets

TRANSCONDUCTANCE FILTER CIRCUIT

BACKGROUND

The disclosure relates in general to transconductance filter circuits. In particular, the disclosure relates to a transconductance filter circuit for digital video disk (DVD) systems.

FIG. 1 is a circuit diagram of a conventional GM-C filter. A conventional GM-C filter comprises a transconductor GM and two capacitor arrays 10. In practice, frequency banks of the GM-C filter are switched using capacitor switches $S_1 \sim S_n$. For example, read signals generated by a read circuit of a disc drive are in different frequency banks when the disc drive operates at different speeds. In FIG. 1, capacitor switch circuits $S_1 \sim S_n$ are arranged in an array, connected between output terminals $V_o+$ or $V_o-$ of transconductor GM and a ground level. Switch transistors M of capacitor switch circuits $S_1 \sim S_n$ are respectively turned on or turned off according the logic level of bit control signals $V_1 \sim V_n$. Capacitance of capacitors $C_1 \sim C_n$ are respectively c, 2c, 4c, ..., $2^n$c. Capacitors with larger capacitance are larger. As capacitor switch circuits controlled by most significant bits (MSB) of a set of control signals are turned off, stray capacitance is larger due to W=Gm/C. The stray capacitance generated by switch transistors limits the range of the operating frequency bank of the conventional transconductance filter circuit.

FIG. 2 is a circuit diagram of another conventional GM-C filter. The difference between FIG. 2 and FIG. 1 is that the capacitor arrays 10' are connected between output terminals $V_o+$ or $V_o-$ of transconductor GM, capacitance of capacitors $C_1' \sim C_n'$ in capacitor switch circuits $S_1' \sim S_n'$ are respectively c/4, 2c/4, ..., $2^n$c/4. As the capacitance of capacitors are ¼ of that in FIG. 1, the total size of the capacitors in FIG. 4 is relativly smaller. In addition, the equivalent capacitance of each capacitor switch circuit $S_1' \sim S_n'$ is the same as that of corresponding capacitor switch circuits $S_1 \sim S_n$. Using capacitor switch circuit $S_1'$ as an example, the equivalent capacitance of two capacitors $C_1'$ with capacitance c/4 connected in parallel is c/2, which is the same with that of two capacitors $C_1$ with capacitance c connected in serial in FIG. 1. As the capacitor switch circuits controlled by least significant bits (LSB) of control signals is turned on, the output of capacitor switch circuits is influenced by the stray capacitance generated by bottom metal-dielectric-metal BMIM, deteriorating frequency response in high frequency operation.

SUMMARY

Transconductance filter circuits are provided. An embodiment of a transconductance filter circuit comprises: a transconductor comprising two inputs for receiving two differential voltages, and a first output terminal and a second output terminal for outputting two differential signals; a first capacitor array, comprising at least one first switch capacitor unit controlled by a first signal, a first equivalent capacitor coupled between the first output terminal and the second output terminal when the first signal is enabled; and two second capacitor arrays, each second capacitor array comprising at least one second switch capacitor unit controlled by a second signal, two second equivalent capacitors respectively coupled between the first output terminal and a ground level, and between the second output terminal and the ground level when the second signal is enabled, wherein the capacitance of the first equivalent capacitor exceeds that of the two second equivalent capacitors connected in serial.

BRIEF DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

DETAILED DESCRIPTION

Figure 1:
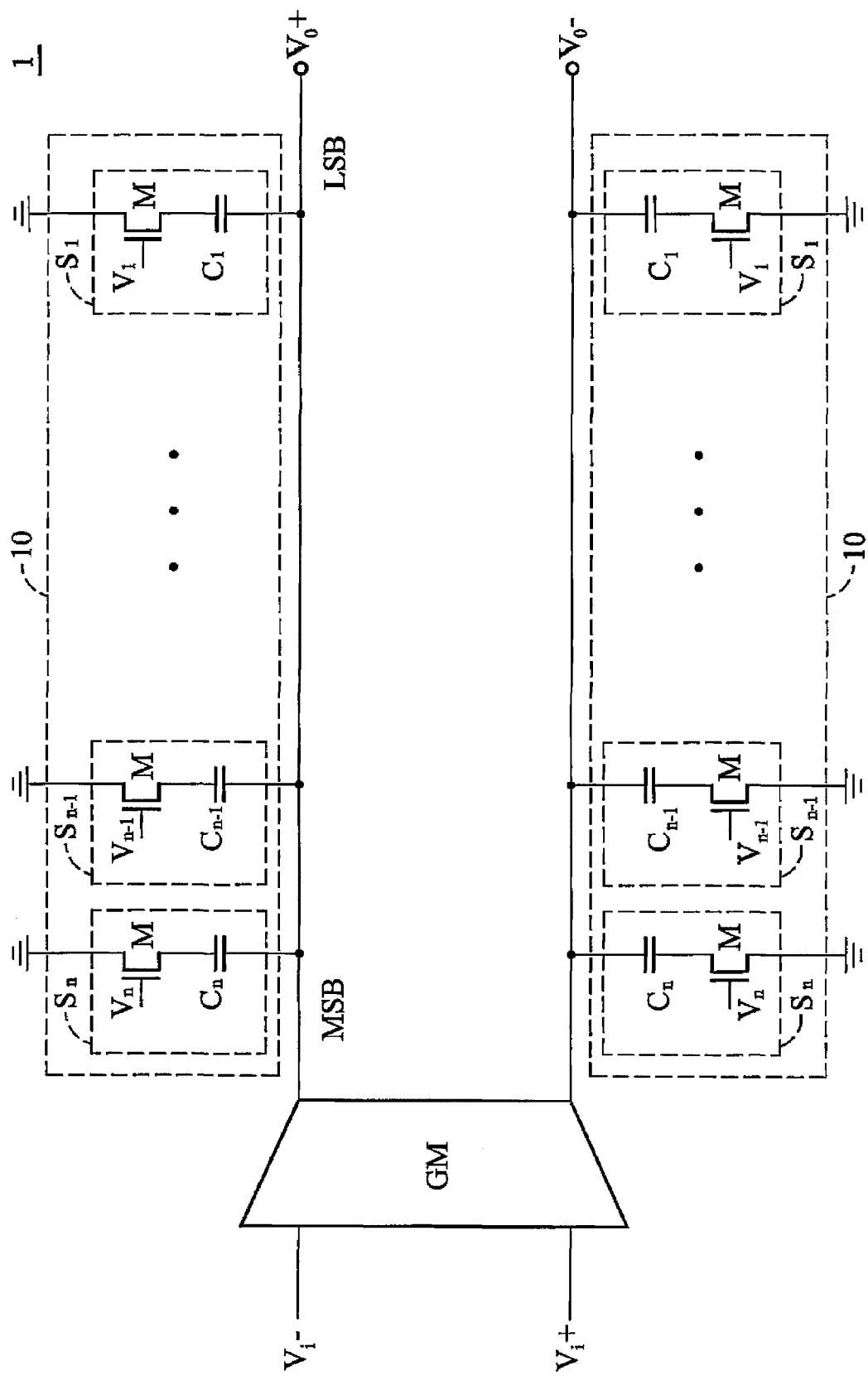
FIG. 1 is a circuit diagram of a conventional GM-C filter.
Figure 2:
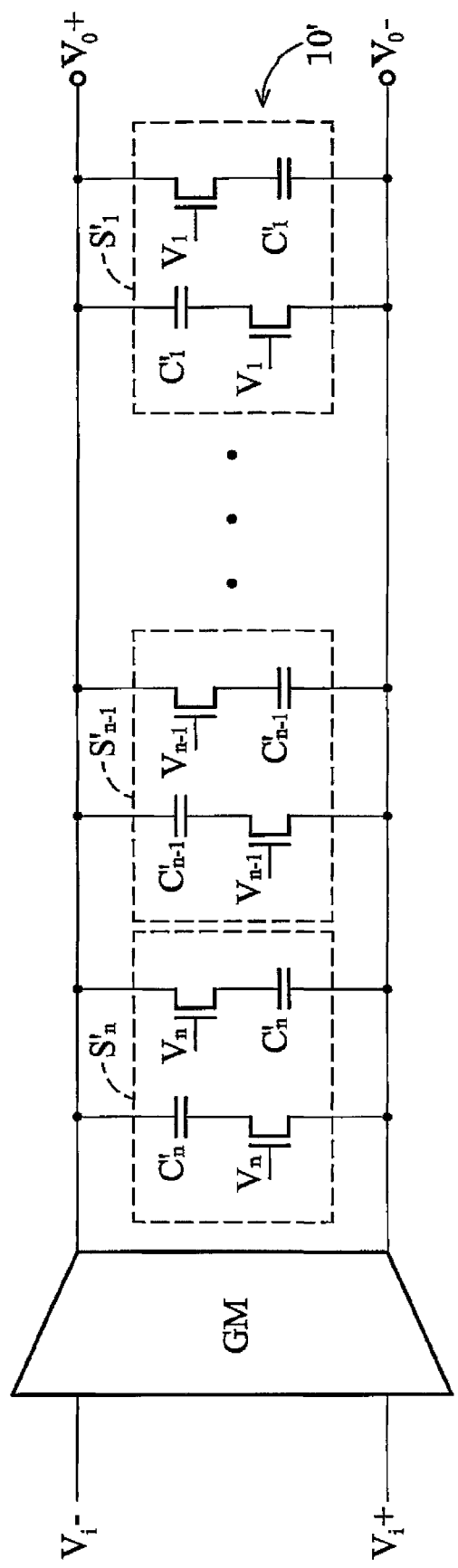
FIG. 2 is a circuit diagram of another conventional GM-C filter.
Figure 3:
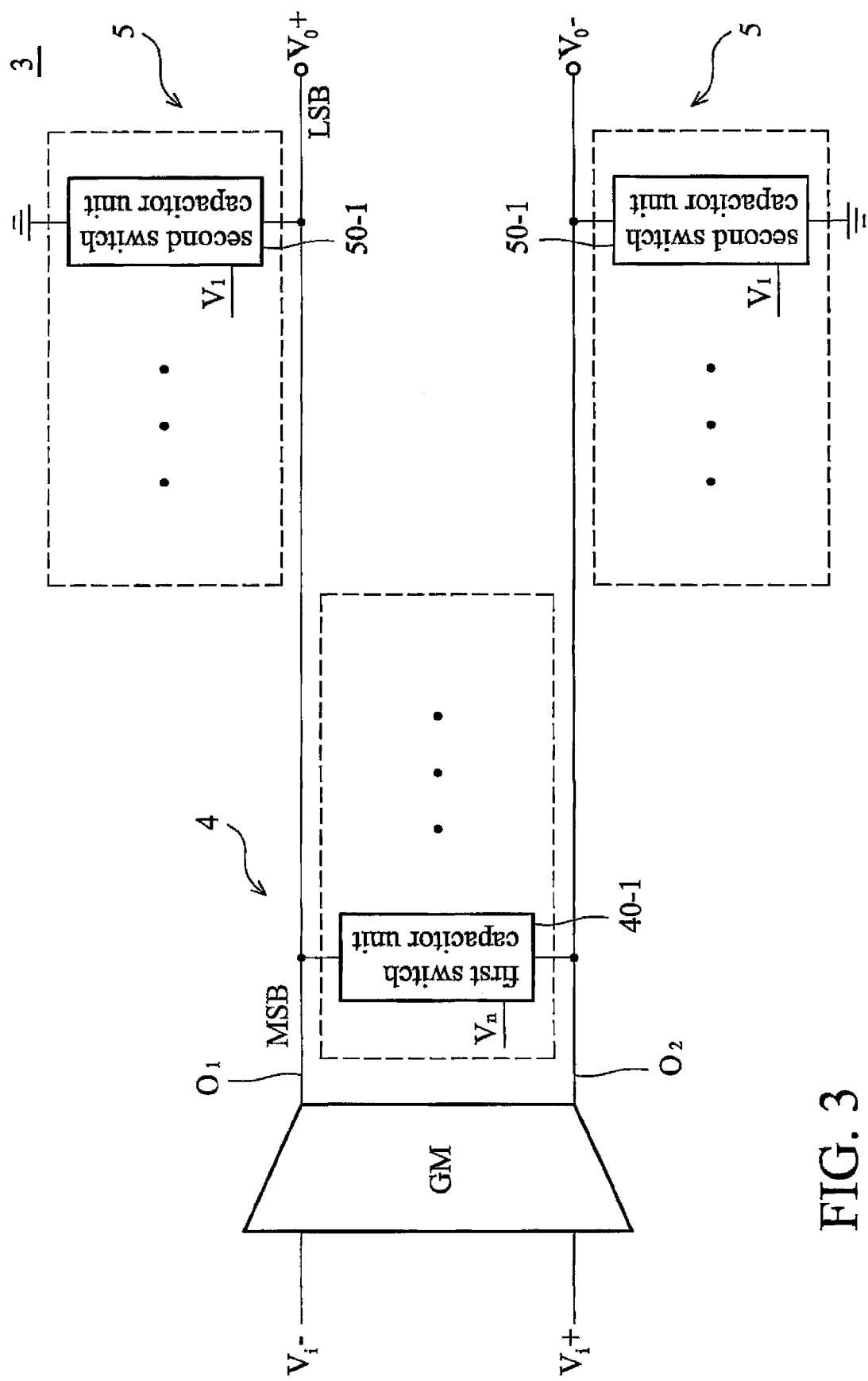
FIG. 3 is a circuit diagram of a transconductance filter circuit according to an embodiment of the invention.

FIG. 3 is a circuit diagram of a transconductance filter circuit according to an embodiment of the invention, comprising a transconductor GM, a first capacitor array 4 and two second capacitor arrays 5.

Transconductor GM comprises two inputs for receiving differential voltages $V_i+$ and $V_i-$, and a first output terminal $O_1$ and a second output terminal $O_2$ for outputting two differential signals. Currents in the transconductor GM generate differential voltages $V_o+$ and $V_o-$ by capacitor coupling.

First capacitor array 4 comprises at least one first switch capacitor unit 40-1 controlled by a first signal $V_n$, MSB of a set of bit control signal as an example. A first equivalent capacitor is coupled between the first output terminal $O_1$ and the second output terminal $O_2$ when the first signal $V_n$ is enabled.

Second capacitor array 5 comprises at least one second switch capacitor unit 50-1 controlled by a second signal $V_1$, LSB of a set of a set of bit control signal as an example. The second equivalent capacitors respectively coupled between the first output terminal $O_1$ and a ground level, and between the second output terminal $O_2$ and the ground level when the second signal $V_1$ is enabled.

The capacitance of the first equivalent capacitor of first switch capacitor units 40-1 are respectively $2^n$ c/2, where n=1,2, ..., n. The capacitance of the second equivalent capacitor of second switch capacitor units 50-1 connected in serial from output terminals $O_1$ and $O_2$ is c/2. Thus, the capacitance of the first equivalent capacitor is $2^n$ times that of the two second equivalent capacitors connected in serial, where n is a natural number.

Figure 4:
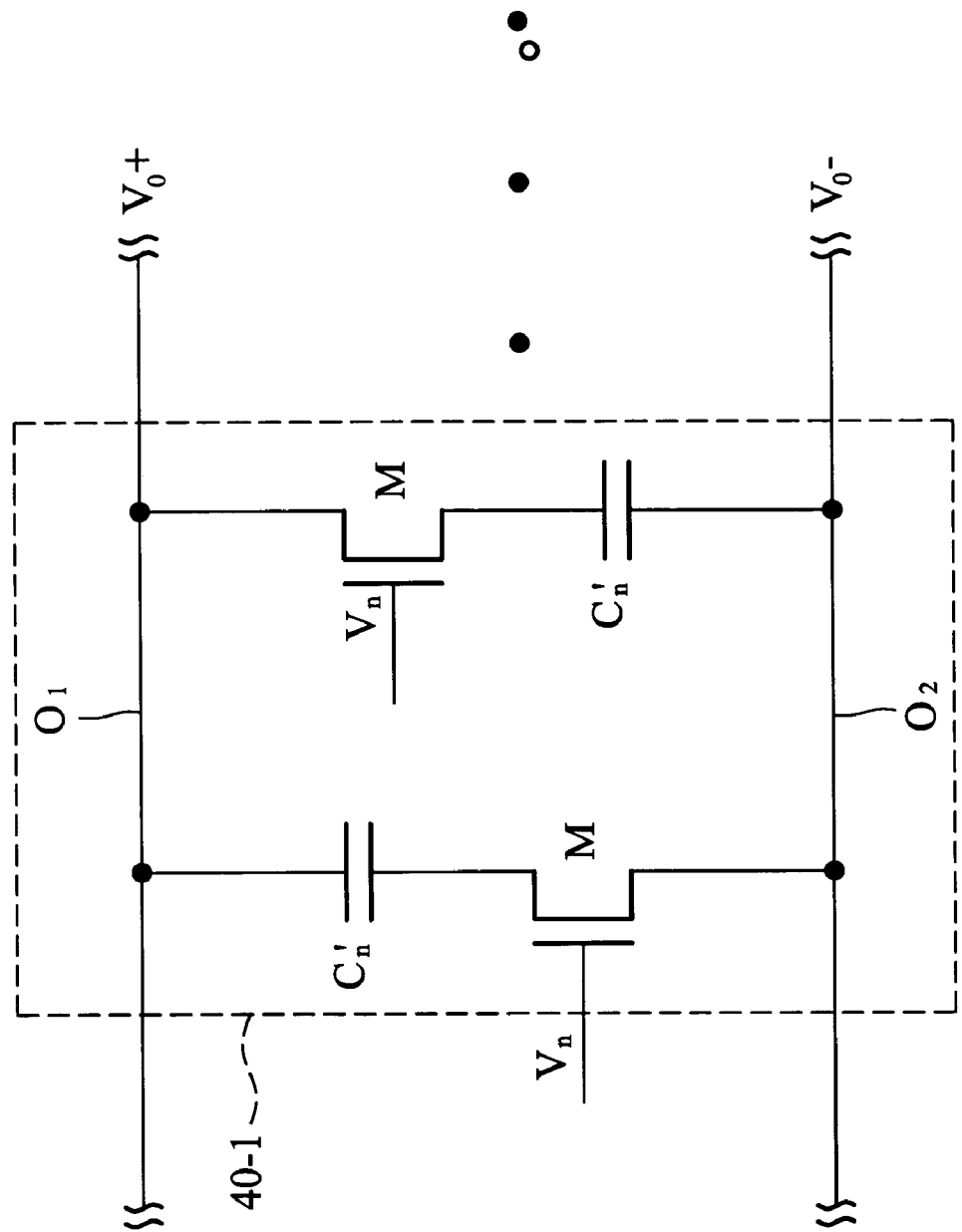
FIG. 4 shows a circuit diagram of first switch capacitor unit 40-1 according to an embodiment of the invention.

FIG. 4 shows a circuit diagram of first switch capacitor unit 40-1 according to an embodiment of the invention. First switch capacitor unit 40-1 comprises two capacitors $C_n'$ and the switches M. One of the switches M and capacitor $C_n'$ are connected in serial between output terminals $O_1$ and $O_2$. The other switches M and capacitor $C_n'$ are connected in serial between output terminals $O_2$ and $O_1$.

FIG. 4 only shows switch M, which is an n-type transistor, switch M can be, however, an n-type transistor or a p-type transistor. Switch M comprises a gate coupled to first signal $V_n$ (MSB of a set of bit control signals as an example), a source/drain coupled to capacitor $C_n'$, and a drain/source coupled to output terminals $O_1$ or $O_2$. Switch M is turned on or turned off according the logic level of the first signal $V_n$.

Figure 5:
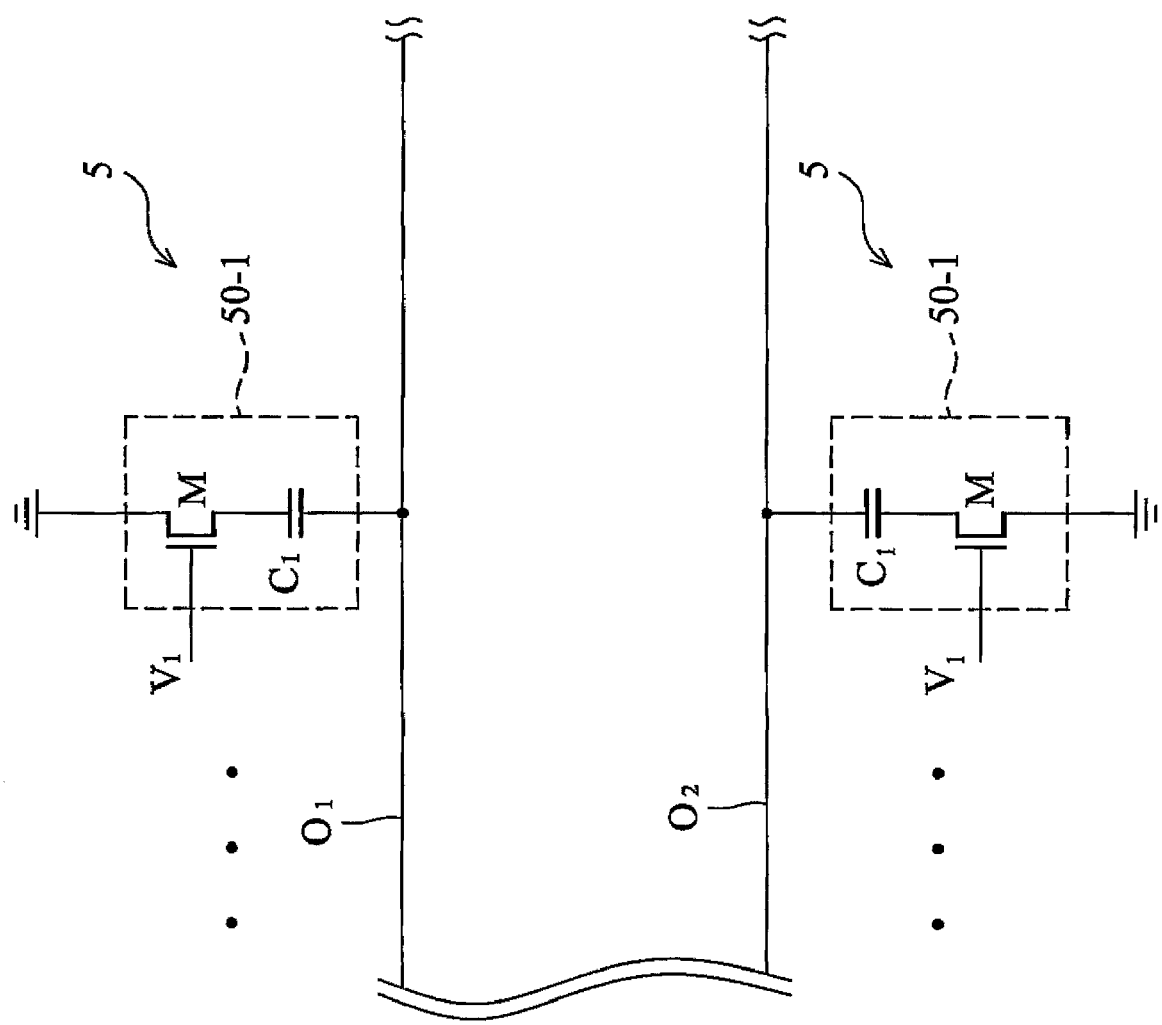
FIG. 5 shows a circuit diagram of second switch capacitor unit 50-1 according to an embodiment of the invention.

FIG. 5 shows a circuit diagram of second switch capacitor unit 50-1 according an embodiment of the invention. Second switch capacitor unit 50-1 comprises capacitor $C_1$ and the switch M. Switch M and capacitor $C_1$ are connected in serial between output terminal $O_1$ and ground level, and between output terminal $O_2$ and ground level.

FIG. 5 only shows switch M, which is an ntype transistor, switch M can be, however, an n-type transistor or a p-type transistor. Switch M comprises a gate coupled to second signal $V_1$ (LSB of a set of bit control signal as an example), a source/drain coupled to capacitor $C_n'$, and a drain/source coupled to output terminals $O_1$ or $O_2$. Switch M is turned on or turned off according the logic level of the second signal $V_1$.

According to the transconductance filter circuit of the invention, when the LSB of the set of bit control signal is asserted, transconductance filter circuit operates at high frequency. Thus, operating second capacitor arrays 5 in FIG. 3 are not influenced by the stray capacitor of switches, improving frequency response in high frequency operation. When the MSB of the set of bit control signals is asserted, the transconductance filter circuit operates at low frequency. Thus, the size of the transistors in operating first capacitor arrays 4 in FIG. 3 is relatively small, with less stray capacitance, improving frequency response in high frequency operation. Thus, the transconductance filter circuit according to the embodiments of the invention operates in wide frequency banks.

The foregoing description of several embodiments have been presented for the purpose of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A transconductance filter circuit, comprising:
   a transconductor comprising two inputs for receiving two differential voltages, and a first output terminal and a second output terminal for outputting two differential signals;
   a first capacitor array comprising at least one first switch capacitor unit controlled by a first signal comprising a most significant bit and omitting a least significant bit of a control signal, and a plurality of first capacitors coupled between the first output terminal and the second output terminal and have a first equivalent capacitance when the first signal is enabled; and
   two second capacitor arrays, each second capacitor array comprising at least one second switch capacitor unit controlled by a second signal comprising the least significant bit and omitting the most significant bit of the control signal, and a plurality of second capacitors, wherein the second capacitors of the two second capacitor arrays are respectively coupled between the first output terminal and a ground level, and between the second output terminal and the ground level, and have a second equivalent capacitance when the second capacitors of the two second capacitor arrays are coupled in serial and the second signal is enabled, wherein the first equivalent capacitance exceeds that of the second equivalent capacitance.

2. The transconductance filter circuit as claimed in claim 1, wherein the first switch capacitor unit comprises:
   a first capacitor coupled to the first output terminal;
   a first switch coupled to the first capacitor in serial between the first output terminal and the second output terminal;
   a second switch coupled to the first output terminal; and
   a second capacitor coupled to the second switch in serial between the first output terminal and the second output terminal.

3. The transconductance filter circuit as claimed in claim 2, wherein the first switch and the second switch are n-type transistors respectively comprising a gate coupled to the first signal, a first source/drain coupled to the first capacitor or the second capacitor, and a second source/drain coupled to the first output terminal or the second output terminal.

4. The transconductance filter circuit as claimed in claim 2, wherein the first switch and the second switch are p-type transistors respectively comprising a gate coupled to the first signal, a first source/drain coupled to the first capacitor or the second capacitor, and a second source/drain coupled to the first output terminal or the second output terminal.

5. The transconductance filter circuit as claimed in claim 1, wherein the second switch capacitor unit comprises a third capacitor and a third switch connected in serial between the ground level and the first output terminal or the second output terminal.

6. The transconductance filter circuit as claimed in claim 5, wherein the third switch is an n-type transistor comprising a gate coupled to the second signal, a third source/drain coupled to the third capacitor, and a fourth source/drain coupled to the ground level.

7. The transconductance filter circuit as claimed in claim 5, wherein the third switch is a p-type transistor comprising a gate coupled to the second signal, a third source/drain coupled to the third capacitor, and a fourth source/drain coupled to the ground level.

8. The transconductance filter circuit as claimed in claim 1, wherein the first equivalent capacitance $2_n$ times of the second equivalent capacitance, where n is a natural number.

* * * * *